(12) United States Patent
Shin

(10) Patent No.: US 7,732,226 B2
(45) Date of Patent: Jun. 8, 2010

(54) METHOD OF MANUFACTURING FLASH MEMORY DEVICE

(75) Inventor: Yong Wook Shin, Gwangju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 30 days.

(21) Appl. No.: 12/273,806

(22) Filed: Nov. 19, 2008

(65) Prior Publication Data
US 2009/0142861 A1    Jun. 4, 2009

(30) Foreign Application Priority Data
Nov. 29, 2007    (KR) .................. 10-2007-0122673

(51) Int. Cl.
*H01L 21/00* (2006.01)
(52) U.S. Cl. .................. 438/15; 438/17; 438/257; 438/598; 257/E23.002
(58) Field of Classification Search ............ 438/15–17, 438/257–268, 598–623; 257/E23.002
See application file for complete search history.

(56) References Cited

U.S. PATENT DOCUMENTS

| | | | | |
|---|---|---|---|---|
| 5,263,003 A | * | 11/1993 | Cowles et al. | 365/230.03 |
| 5,822,244 A | * | 10/1998 | Hansen et al. | 365/185.11 |
| 6,033,955 A | * | 3/2000 | Kuo et al. | 438/257 |
| 6,400,602 B2 | * | 6/2002 | Takata et al. | 365/185.09 |
| 2001/0038554 A1 | * | 11/2001 | Takata et al. | 365/185.09 |
| 2004/0172496 A1 | * | 9/2004 | Schoepflin et al. | 711/5 |
| 2008/0237592 A1 | * | 10/2008 | Sugita et al. | 257/48 |
| 2010/0030949 A1 | * | 2/2010 | Lakhani et al. | 711/103 |

FOREIGN PATENT DOCUMENTS

| | | |
|---|---|---|
| KR | 10-0192588 B1 | 1/1999 |
| KR | 10-0716552 B1 | 5/2007 |

* cited by examiner

*Primary Examiner*—Michael S Lebentritt
(74) *Attorney, Agent, or Firm*—Saliwanchik, Lloyd & Saliwanchik

(57) ABSTRACT

Disclosed are methods of manufacturing a flash memory device. The method can include performing a first test on memory banks of chips on a wafer to record an availability of the banks; performing an inking process on each of the chips according to a number of available banks in the chip; performing a sawing process to divide the chips mounted on the wafer; packaging the divided chips according to the number of available banks in the chip; and performing a verification test on the packaged chips.

20 Claims, 4 Drawing Sheets

METHOD OF MANUFACTURING FLASH MEMORY DEVICE

CROSS-REFERENCE TO RELATED APPLICATION

The present application claims the benefit under 35 U.S.C. §119 of Korean Patent Application No. 10-2007-0122673, filed Nov. 29, 2007, which is hereby incorporated by reference in its entirety.

BACKGROUND

A flash memory device is a nonvolatile memory medium that does not lose data stored therein even if power is turned off. In addition, the flash memory device can record, read and delete data at a relatively high speed.

Accordingly, the flash memory device is widely used for a Bios of a personal computer (PC), a set-top box, a printer or a network server in order to store data. Recently, the flash memory device is extensively used for digital cameras and mobile phones.

BRIEF SUMMARY

Embodiments of the present invention relate to methods of manufacturing a flash memory device.

According to an embodiment, a method of manufacturing a flash memory device can comprise forming a plurality of chips on a wafer and a plurality of banks on each of the plurality of chips; performing a first test on the banks to record an availability of the banks; performing an inking process on each of the chips according to a number of available banks in the chip; performing a sawing process to divide the chips of the wafer; packaging the divided chips; and performing a second test on the packaged chips.

DETAILED DESCRIPTION

Hereinafter, an embodiment will be described with reference to accompanying drawings.

Figure 1:
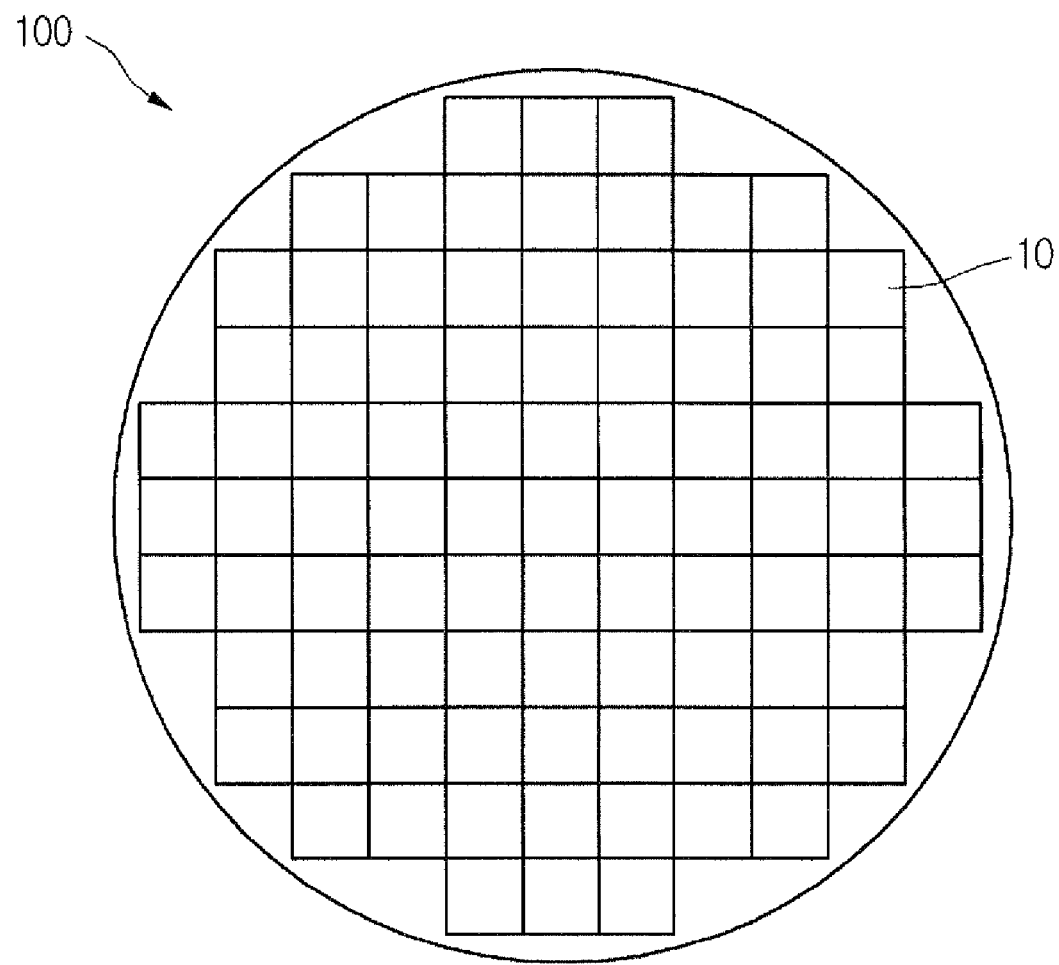
FIG. 1 is a plan view schematically representing a wafer on which a plurality of chips are formed.

Referring to FIG. 1, a wafer 100 can be provided on which a plurality of chips 10 are formed.

Each chip 10 can be fabricated to provide a flash memory including a cell area and a circuit area. The wafer 100 can be subject to a sawing process to divide the chips 10 according to chip unit. Then, the divided chips can be subject to a packaging process to provide a product.

Figure 2:
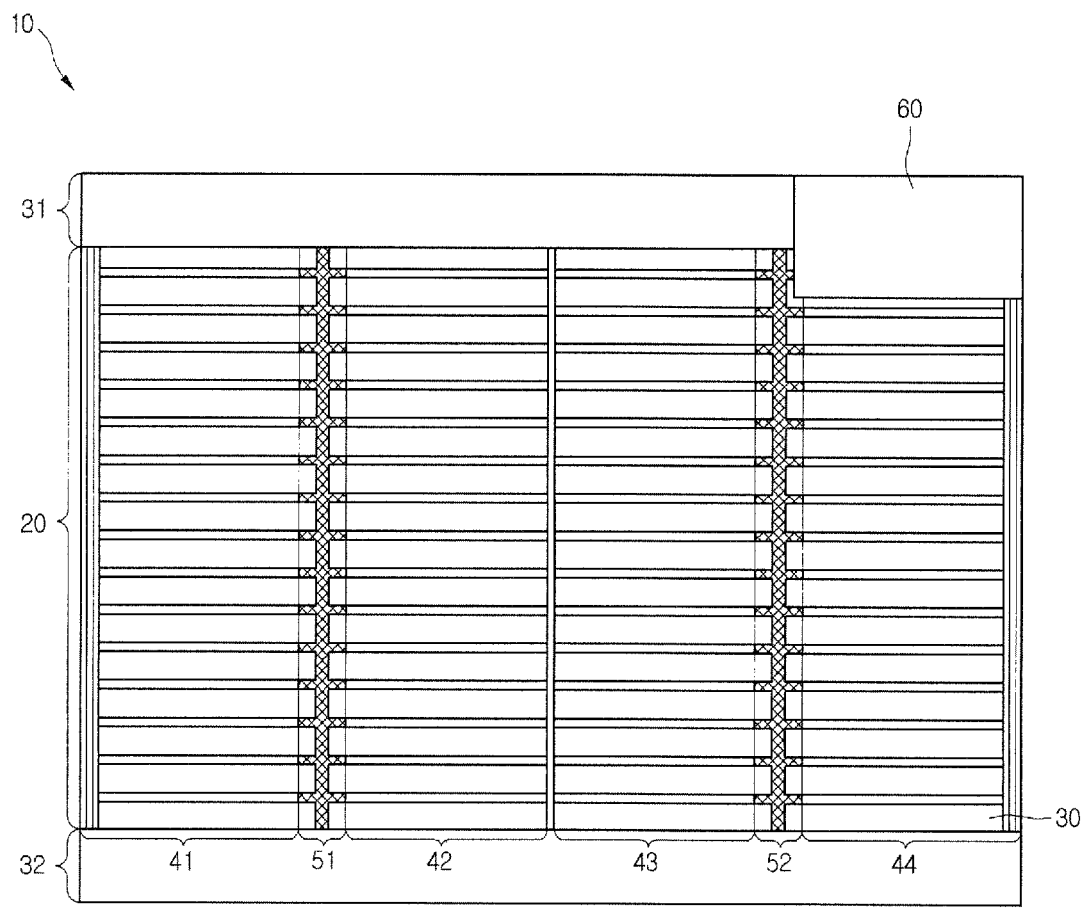
FIG. 2 is a plan view representing one of the chips formed on the wafer.

FIG. 2 is a plan view representing a chip 10 formed on the wafer 100.

The chip 10 can include a first peripheral area 31, a second peripheral area 32, a cell area 20 and a supplier mode area 60.

The cell area 20 can be used to store data. The first peripheral area 31 and the second peripheral area 32 can be provided with a circuit that is connected to the cell area 20 to transmit signals.

The supplier mode area 60 can be provided to store information on the chip 10.

The cell area 20 can include a first bank 41, a second bank 42, a third bank 43 and a fourth bank 44, in which each bank (41, 42, 43 and 44) includes a plurality of sectors 30.

Each sector 30 can include a plurality of cells.

In addition, a first address decoder 51 can be formed between the first bank 41 and the second bank 42, and a second address decoder 52 can be formed between the third bank 43 and the fourth bank 44.

The first and second address decoders 51 and 52 provide addresses of the sectors 30 to the supplier mode area 60.

Figure 3:
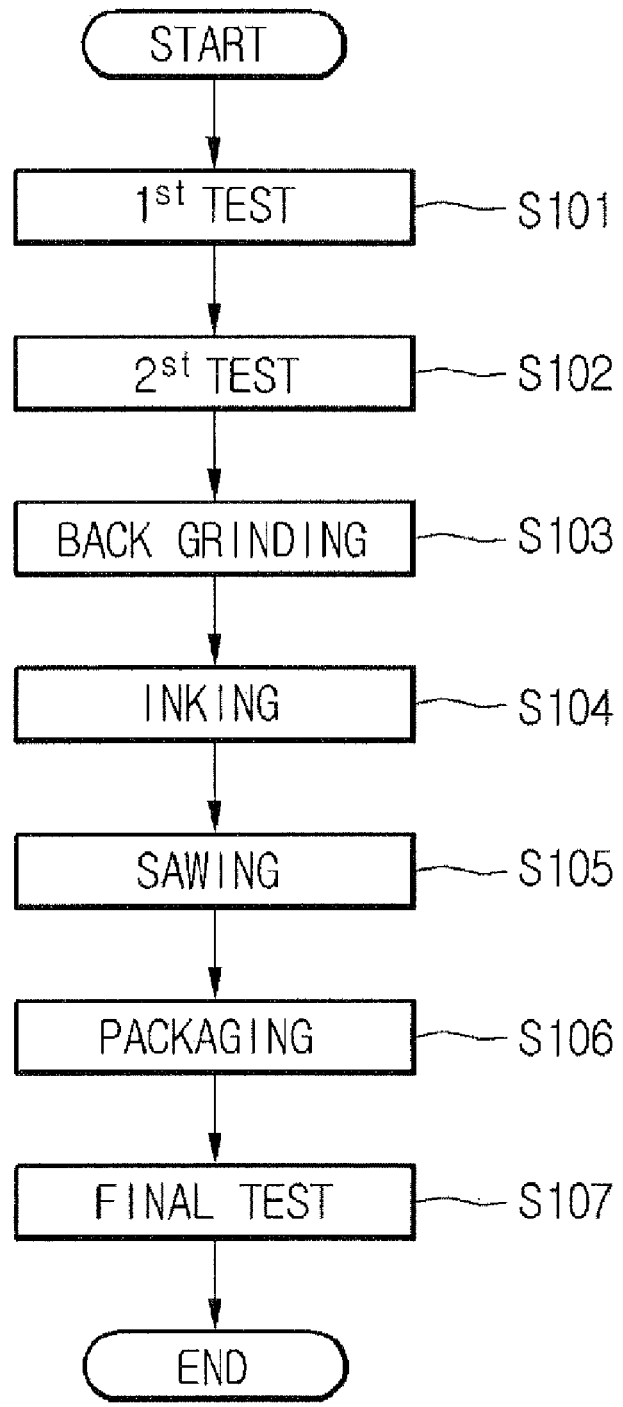
FIG. 3 is a flowchart representing a method of manufacturing a flash memory device according to an embodiment of the present invention.

FIG. 3 is a flowchart representing a method of manufacturing a flash memory device according to an embodiment of the present invention.

After a flash memory is fabricated according to unit chip, a first test (S101) can be performed on the chips 10 formed on the wafer 100.

The first test can be performed to check the chips 10 formed on the wafer 100 through an electrical scheme. According to an embodiment of the present invention, the first test can be performed as described with reference to FIG. 4.

Figure 4:
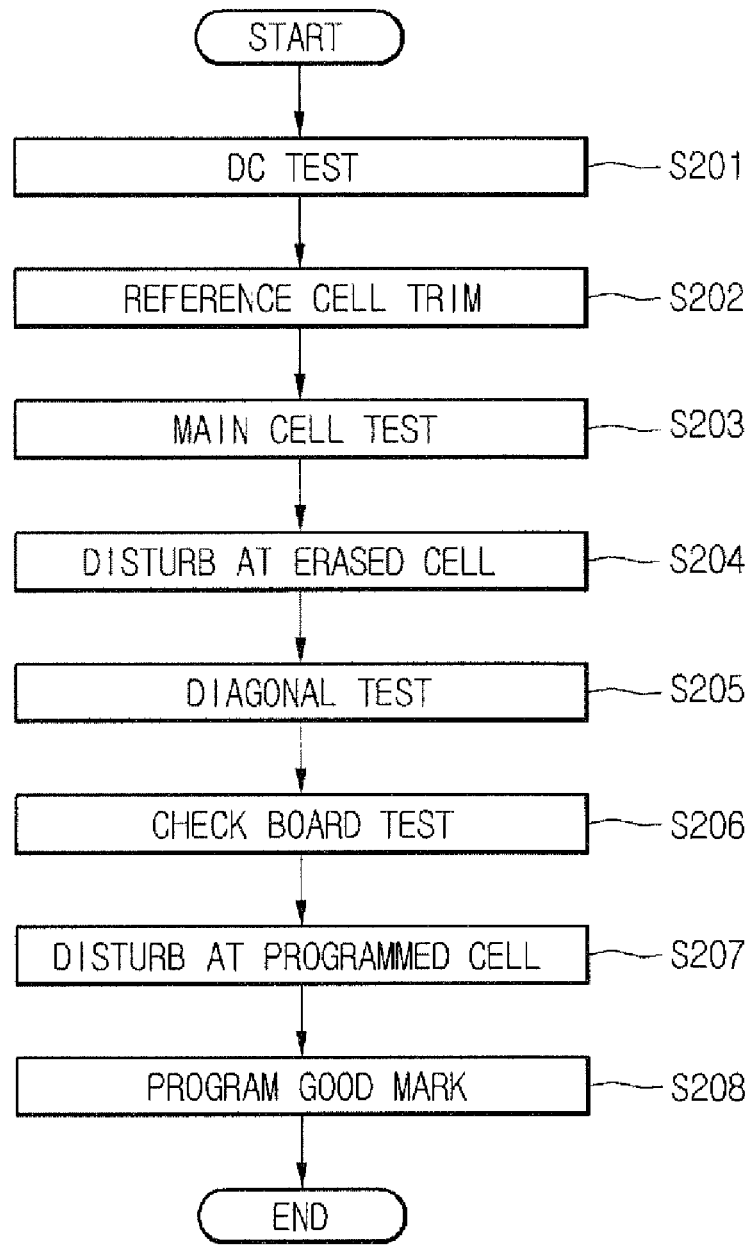
FIG. 4 is a flowchart illustrating a procedure of a first test according to an embodiment of the present invention.

Referring to FIG. 4, the first test can include the steps of performing a DC test (S201), and preparing a reference cell for use (S202).

The reference cell is a cell provided on the first and second peripheral areas 31 and 32. The normalcy of the cells formed on a cell area 20 can be determined by comparing the cells formed on the cell area 20 with the reference cell.

Once the reference cell is prepared as in step (S202), the cell formed on the cell area 20 is ready to be tested during the main cell test (S203).

An erase process is performed on the cell formed on the cell area 20 and a test is performed on the erased cell (S204).

The above test is to check if the erased cell maintains in the erased state, and can be achieved by applying stress to a word line and a bit line.

If the erased cell becomes programmed when the word line and the bit line are subject to the stress, the corresponding sector is not used because of this defect. Thus, this information is input to the supplier mode area 60 through the first and second address decoders 51 and 52.

After the test for the erased cell has been performed, a diagonal test (S205) and a checker board test (S206) can be performed to check interaction between the cells.

The diagonal test and the checker board test can be used to check if the cells exert an influence on each other or if current leakage occurs in the cells.

Subsequently, a program process can be performed on a cell, and a test can be performed on the programmed cell (S207).

The above test is to check if the programmed cell maintains in the programmed state, and can be achieved by applying stress to the word line and the bit line.

After the test for the programmed cell has been performed, information on the availability of the first bank 41, the second bank 42, the third bank 43, and the fourth bank 44 is input to the supplier mode area 60 (S208).

If a non-available sector 30 exists in one of the four banks (41, 42, 43 and 44), information is input into the supplier mode area 60 to prevent the bank having the corresponding sector 30 from being used.

According to the related art, if there is any one of non-available banks, the chip 10 is discarded. However, according to the present invention, the information is input to the supplier mode area 60 to prevent the non-available bank from being used and to allow the remaining available banks to be used.

Referring back to FIG. 3, a second test (S102) can be performed on the chip 10, which has been subject to the first test (S102).

The second test can be performed similarly to the first test, by applying external stress to the wafer 100 on which the chip 10 is formed.

The external stress can be applied by heating the wafer 100 for about 24 hours at a temperature of about 250° C.

Then, a back grinding process (S103) can be performed on the wafer 100.

The back grinding process is to remove a rear surface of the wafer 100 to prepare the wafer for the packaging process, which will be performed later.

Then, an inking process (S104) can be performed on the chip 10 of the wafer 100, which has been subject to the back grinding process.

The inking process is to mark the chips 10 with colors according to the number of the available banks in the chip 10.

For example, in one embodiment, if all four of the banks (41, 42, 43 and 44) are available, the chip 10 is not marked, and if three banks of the four banks (41, 42, 43 and 44) are available, the chip 10 is marked with a first color ink. The first color ink can be, for example, red ink.

If two banks of the four banks (41, 42, 43 and 44) are available, the chip 10 can be marked with a second color ink. The second color ink can be, for example, blue ink. If one of the four banks (41, 42, 43 and 44) is available, the chip 10 is marked with a third color ink. The third color ink can be, for example, green ink. If none of the four banks (41, 42, 43 and 44) is available, the chip 10 is marked with a fourth color ink. The fourth color ink can be, for example, black ink.

The inking process can be performed by marking a part of the chip using fat-soluble ink. In an embodiment, the number of the available banks in the chip 10 can be read from the supplier mode area of the chip 10.

If the chip 10 is fabricated in the form of a 64 MB memory, the first bank 41, the second bank 42, the third bank 43, and the fourth bank 44 each have a capacity of 16 MB.

If the chip 10 is not marked, the chip 10 has a 64 MB memory. If the chip 10 is marked with the first color ink (e.g., a red ink mark), the chip 10 has a 48 MB memory. If the chip 10 is marked with the second color ink (e.g., a blue ink mark), the chip 10 has a 32 MB memory. If the chip 10 is marked with the third color ink (e.g., a green ink mark), the chip 10 has a 16 MB memory.

That is, the available memory of the chip 10 is distinguished according to the color of the ink.

After the inking process, the wafer 10 is subject to a sawing process (S105) in which the wafer 100 is cut in a chip unit.

The sawing process is to divide chips that are mounted on the wafer 100.

After that, a chip 10 divided through the sawing process is subject to the packaging process (S106).

The packaging process can be performed by grouping the chips 10 according to the color of the ink marking the chip.

That is, the packaging process is performed by grouping the chip 10 according to the memory capacity of the chips 10, and packaging accordingly.

The packaging process can include a laser marking process for marking the memory capacity to be recognized by customers.

A third test (final test) can be performed on the chip 10, which has been subject to the packaging process (S107).

The final test is to check the normalcy of the chips 10. The final test can be performed by grouping the chips 10 according to the memory capacity of the chip 10.

That is, the above test is distinctively performed according to the available capacity of the chips 10 by grouping the chips 10 according to the available capacity based on the number of available banks.

The chip 10, which has passed the final test, can be used for sale according to the memory capacity.

That is, according to the related art, if there are any non-available banks in a chip, the chip is discarded. As a result, available banks are also discarded.

However, according to the present invention, the available state or the non-available state of the banks is marked with colors according to the number of available banks such that the chips can be distinctively supplied to customers. This can result in less waste.

That is, the chip can be sold according to the available memory capacity of the chip, so that the manufacturing cost of the memory device is reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a flash memory device, comprising:
   providing a wafer comprising a plurality of chips, wherein each chip comprises a plurality of banks for a flash memory;
   performing a first test process on the banks to record an availability of the banks for each chip;
   performing an inking process on each of the chips according to a number of available banks in the chip;
   performing a sawing process with respect to the wafer to divide the chips; and
   packaging the divided chips in accordance with the number of the available banks.

2. The method according to claim 1, further comprising performing a verification test on the packaged chips.

3. The method according to claim 2, wherein performing the verification test comprises verifying the number of available banks in the chip, wherein the number of available banks in the chip corresponds to available memory capacity.

4. The method according to claim 1, further comprising: performing a second test on the wafer after performing the first test process.

5. The method according to claim 4, wherein performing the second test comprises applying heat to the wafer to check external stress properties of each chip.

6. The method according to claim 5, wherein performing the second test comprises applying heat at a temperature of about 250° C. to the wafer for about 24 hours.

7. The method according to claim 1, further comprising performing a back grinding process on the wafer after performing the first test process.

8. The method according to claim 1, wherein, performing the inking process comprises marking chips with a color ink, the color ink corresponding to the number of the available banks provided in the chips.

9. The method according to claim 8, wherein during the inking process, chips having all banks available are not marked with the color ink.

10. The method according to claim 8, wherein each chip comprises four banks, wherein the color ink for the inking process comprises a first color ink, a second color ink, a third color ink, and a fourth color ink, wherein chips having three banks available are marked with the first color ink, wherein chips having two banks available are marked with a second color ink, wherein chips having one bank available are marked with a third color ink, and wherein chips having no banks available are marked with the third color ink.

11. The method according to claim 10, wherein packaging the divided chips comprises:
grouping together the chips having the first color ink;
grouping together the chips having the second color ink;
grouping together the chips having the third color ink;
grouping together the chips having the fourth color ink; and
marking chips of each group with corresponding memory capacity.

12. The method according to claim 11, wherein during the inking process, chips having all banks available are not marked with the color ink, wherein packaging the divided chips further comprises grouping together the chips that are not marked with the color ink.

13. The method according to claim 8, wherein packaging the divided chips comprises grouping the chips according to the color of the color ink marked thereupon.

14. The method according to claim 1, wherein available memory capacity of each chip is determined by the number of the available banks, wherein packaging the divided chips comprises:
grouping the divided chips according to the available capacity; and
performing a laser marking process for marking the available memory capacity on the chip.

15. The method according to claim 14, further comprising performing a verification test to verify the accuracy of the available capacity.

16. The method according to claim 1, wherein packaging the divided chips comprises performing a laser marking process for marking available memory capacity according to the number of the available banks in the chip.

17. The method according to claim 1, wherein performing the inking process comprises putting a mark on the chip using fat-soluble ink.

18. The method according to claim 1, wherein each chip further comprises a supplier mode area.

19. The method according to claim 18, wherein performing the first test comprises recording information on the availability of the banks in the supplier mode area.

20. The method according to claim 19, wherein performing the inking process comprises:
reading the information on the availability of the banks from the supplier mode area; and
marking the chips with a color ink according to the availability of the banks.

* * * * *